US010139729B2

(12) United States Patent
Yaguchi et al.

(10) Patent No.: US 10,139,729 B2
(45) Date of Patent: Nov. 27, 2018

(54) COATING COMPOSITION FOR PATTERN REVERSAL ON SOC PATTERN

(71) Applicant: NISSAN CHEMICAL INDUSTRIES, LTD., Tokyo (JP)

(72) Inventors: Hiroaki Yaguchi, Toyama (JP); Makoto Nakajima, Toyama (JP); Wataru Shibayama, Toyama (JP); Satoshi Takeda, Toyama (JP); Hiroyuki Wakayama, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/504,107

(22) PCT Filed: Aug. 11, 2015

(86) PCT No.: PCT/JP2015/072770
§ 371 (c)(1),
(2) Date: Feb. 15, 2017

(87) PCT Pub. No.: WO2016/031563
PCT Pub. Date: Mar. 3, 2016

(65) Prior Publication Data
US 2017/0271151 A1     Sep. 21, 2017

(30) Foreign Application Priority Data
Aug. 25, 2014   (JP) .................................. 2014-170347

(51) Int. Cl.
*G03F 7/075*    (2006.01)
*G03F 7/40*     (2006.01)
(Continued)

(52) U.S. Cl.
CPC ......... *G03F 7/0752* (2013.01); *C09D 183/04* (2013.01); *G03F 7/038* (2013.01);
(Continued)

(58) Field of Classification Search
CPC ... G03F 7/052; G03F 7/38; G03F 7/40; G03F 7/11; G03F 7/0752; H01L 21/0274; C08L 83/04; C09D 183/04
(Continued)

(56) References Cited

U.S. PATENT DOCUMENTS 8,658,641 B2 *  2/2014  Barvian ............... C07D 498/22
                                                     514/231.2
9,165,781 B2 * 10/2015  Sakaida .................. C08G 77/20
(Continued)

FOREIGN PATENT DOCUMENTS

JP  2002-110510       4/2002
JP  2004-363371 A    12/2004
(Continued)

OTHER PUBLICATIONS

Machine translation of Jp 2008-216530 (no. date).*
(Continued)

*Primary Examiner* — Amanda C. Walke
(74) *Attorney, Agent, or Firm* — Oliff PLC

(57) ABSTRACT

A resin composition for pattern reversal can be embedded between traces of the pattern of a stepped substrate formed on the substrate to be processed and can form a smooth film. A polysiloxane composition for coating used in the steps of forming an organic underlayer film on a semiconductor substrate, applying a silicon hard mask-forming composition onto the underlayer film and baking the applied silicon hard mask-forming composition to form a silicon hard mask, applying a resist composition onto the silicon mask to form a resist film, exposing the resist film to light and developing
(Continued)

the resist film after exposure to give a resist pattern, etching the silicon mask, etching the underlayer film, applying the polysiloxane composition for coating onto the patterned organic underlayer film to expose an upper surface of the underlayer film by etch back, and etching the underlayer film to reverse the pattern.

6 Claims, 2 Drawing Sheets

(51) Int. Cl.

| | | |
|---|---|---|
| C09D 183/04 | (2006.01) | |
| G03F 7/038 | (2006.01) | |
| G03F 7/039 | (2006.01) | |
| G03F 7/16 | (2006.01) | |
| G03F 7/20 | (2006.01) | |
| G03F 7/32 | (2006.01) | |
| G03F 7/38 | (2006.01) | |
| H01L 21/02 | (2006.01) | |
| H01L 21/027 | (2006.01) | |
| H01L 21/033 | (2006.01) | |
| H01L 21/311 | (2006.01) | |
| G03F 7/09 | (2006.01) | |

(52) U.S. Cl.
CPC .............. *G03F 7/039* (2013.01); *G03F 7/094* (2013.01); *G03F 7/168* (2013.01); *G03F 7/20* (2013.01); *G03F 7/32* (2013.01); *G03F 7/38* (2013.01); *G03F 7/40* (2013.01); *H01L 21/0274* (2013.01); *H01L 21/02126* (2013.01); *H01L 21/0332* (2013.01); *H01L 21/0337* (2013.01); *H01L 21/31111* (2013.01); *H01L 21/31133* (2013.01); *H01L 21/31144* (2013.01)

(58) Field of Classification Search
USPC ... 430/270.1, 271.1, 273.1, 282.1, 322, 325, 430/329, 330, 331; 438/703; 428/448
See application file for complete search history.

(56) References Cited

U.S. PATENT DOCUMENTS

| | | | | |
|---|---|---|---|---|
| 2007/0102397 | A1* | 5/2007 | Schroeder | H01L 21/76816 216/41 |
| 2011/0117746 | A1* | 5/2011 | Maruyama | C08L 83/04 438/703 |
| 2012/0122037 | A1* | 5/2012 | Bradford | G03F 7/405 430/325 |
| 2012/0126358 | A1 | 5/2012 | Arnold et al. | |
| 2012/0276483 | A1* | 11/2012 | Ogihara | G03F 7/0752 430/319 |
| 2014/0017896 | A1* | 1/2014 | Sakaida | C08G 77/20 438/694 |
| 2014/0120730 | A1* | 5/2014 | Nakajima | G03F 7/40 438/703 |
| 2014/0225252 | A1* | 8/2014 | Lin | H01L 23/49811 257/737 |
| 2014/0234785 | A1 | 8/2014 | Hatakeyama et al. | |
| 2015/0048046 | A1* | 2/2015 | Dei | C08G 77/388 216/2 |

FOREIGN PATENT DOCUMENTS

| | | |
|---|---|---|
| JP | 2008-216530 A | 9/2008 |
| JP | 2008-287176 | 11/2008 |
| JP | 2009-301007 A | 12/2009 |
| JP | 2010-169894 A | 8/2010 |
| WO | 2010/010928 A1 | 1/2010 |
| WO | 2010/123032 A1 | 10/2010 |
| WO | 2012/132686 A1 | 10/2012 |

OTHER PUBLICATIONS

Sep. 15, 2015 Written Opinion issued in International Patent Application No. PCT/JP2015/072770.
Sep. 15, 2015 International Search Report issued in International Patent Application No. PCT/JP2015/072770.

* cited by examiner

COATING COMPOSITION FOR PATTERN REVERSAL ON SOC PATTERN

TECHNICAL FIELD

The present invention relates to a coating composition for pattern reversal, which relates to preparation of an electronic devices, for forming a microscopic pattern.

BACKGROUND ART

Microfabrication by lithography using a photoresist composition has been carried out in manufacture of semiconductor devices. The microfabrication is a processing method including forming a thin film of a photoresist composition on a substrate to be processed such as a silicon wafer, irradiating the formed thin film with active light through a mask pattern formed by drawing a semiconductor device pattern on the formed thin film, developing the irradiated thin film, and etching the substrate to be processed such as a silicon wafer using the obtained photoresist pattern as a protecting film. In recent years, however, semiconductor devices have been further integrated, and the active light to be used has tended to have a shorter wavelength from a KrF excimer laser (248 nm) to an ArF excimer laser (193 nm). This raises serious problems of the effects of diffused reflection of active light from the substrate and standing wave. Consequently, a method for providing a bottom anti-reflective coating (BARC) between a photoresist and a substrate to be processed has been widely studied. For example, a composition for forming a photosensitive resist underlayer film containing a polymer including an acrylamide structure has been described (refer to Patent Document 1).

A composition for forming a resist underlayer film containing a polymer having a unit structure of hydroxyacrylamide has been described (refer to Patent Document 2).

A composition for forming an anti-reflective coating containing a polymer including a unit structure of the hydroxyalkylene methacrylamide and a unit structure of aromatic alkylene methacrylate has been described (refer to Patent Document 3).

In future, when finer resist pattern formation will progress, the problem of resolution and the problem of collapse of the resist pattern after development will arise and thus a thinner resist film formation will be desired. Since the sufficient resist pattern thickness required for substrate processing is difficult to obtain, a process in which not only the resist pattern but also the resist underlayer film formed between the resist and the semiconductor substrate to be processed has the function as a mask is required. As the resist underlayer film for such a process, a resist underlayer film for lithography having the selectivity of a dry etching rate close to that of the resist, a resist underlayer film for lithography having the selectivity of dry etching rate smaller than that of the resist, or a resist underlayer film for lithography having the selectivity of dry etching rate smaller than that of the semiconductor substrate, which is different from conventional resist underlayer films having high etch rate properties (fast etching rate), has been required.

With formation of a finer pattern, a patterning method of reversing the pattern has been disclosed (refer to Patent Documents 1 and 2). A method for producing electronic devices has been disclosed (refer to Patent Document 3). The method includes (a) sequentially forming an anti-reflective coating and a resist on a film to be processed as a patterning target, (b) forming an opening in a predetermined region of the resist by an exposure process and a development process to remove the anti-reflective coating in the opening, (c) applying a predetermined insulating film material on the resist in which the opening is formed and baking the applied insulating film material to form an application type insulating film, (d) removing the application type insulating film existing except within the opening, (e) forming a first mask pattern formed of the application type insulating film in the predetermined region by removing the resist and the anti-reflective coating, and (f) patterning the film to be processed by etching the film to be processed using the first mask as a mask.

PRIOR ART DOCUMENTS

Patent Documents

Patent Document 1: Japanese Patent Application Publication No. 2008-287176 (JP 2008-287176 A)
Patent Document 2: Japanese Patent Application Publication No. 2002-110510 (JP 2002-110510 A)
Patent Document 3: Japanese Patent Application Publication No. 2004-363371 (JP 2004-363371 A)

SUMMARY OF THE INVENTION

Problems to be Solved by the Invention

An object of the present invention is to provide a resin composition for pattern reversal that can be excellently embedded between traces of the pattern of a stepped substrate formed on the substrate to be processed and can form a smooth film.

Means for Solving the Problem

The present invention includes, as a first aspect, a polysiloxane composition for coating comprising: a hydrolysis condensate of a hydrolyzable silane comprising the hydrolyzable silane having two to three hydrolyzable groups in a proportion of 30 mol % to 100 mol % in the total silanes, in which the composition is used in a method for reversing a pattern on a SOC pattern, the method comprising the steps of: (1) forming an organic underlayer film on a semiconductor substrate; (2) applying a silicon hard mask-forming composition onto the organic underlayer film and baking the applied silicon hard mask-forming composition to form a silicon hard mask; (3) applying a resist composition onto the silicon hard mask to form a resist film; (4) exposing the resist film to light and developing the resist film after exposure to give a resist pattern; (5) etching the silicon hard mask using the resist pattern; (6) etching the organic underlayer film using the patterned silicon hard mask to form a patterned organic underlayer film; (7) applying the polysiloxane composition for coating onto the patterned organic underlayer film to expose an upper surface of the organic underlayer film by etch back; and (8) etching the organic underlayer film to reverse the pattern, as a second aspect, the polysiloxane composition for coating according to the first aspect, in which the hydrolyzable silane is a hydrolyzable silane of Formula (1):

$$R^1{}_a Si(R^2)_{4-a} \qquad \text{Formula (1)}$$

(in Formula (1), $R^1$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, or a cyano group and bonding to a silicon atom through a Si—C bond; $R^2$ is an alkoxy group, an acyloxy group, or a halogen group; and a is an integer of 0 to 2) and a comprises a hydrolyzable silane, in which a in Formula (1) is 1 or 2, in a proportion of 30 mol % to 100 mol % and a hydrolyzable silane, in which a in Formula (1) is 0, in a proportion of 0 mol % to 70 mol % in the total silanes, as a third aspect, the polysiloxane composition for coating according to the second aspect, in which the composition comprises the hydrolysis condensate of the hydrolyzable silane comprising the hydrolyzable silane of Formula (1) (where a is 1 or 2) in a proportion of 100 mol % in the total silanes and a crosslinkable compound having two to six methoxymethyl groups, as a fourth aspect, the polysiloxane composition for coating according to the second aspect or the third aspect, in which $R^1$ in Formula (1) is a methyl group or a phenyl group optionally substituted with a halogen group or an alkoxy group, as a fifth aspect, the polysiloxane composition for coating according to any one of the first aspect to the fourth aspect, in which hydrolysis of the hydrolyzable silane is carried out using an acid or a base as a hydrolysis catalyst, as a sixth aspect, the polysiloxane composition for coating according to any one of the first aspect to the fifth aspect, further comprising one or more substances selected from the group consisting of water, an acid, and a curing catalyst, and as a seventh aspect, a method for producing a semiconductor device comprising the steps of: (1) forming an organic underlayer film onto a semiconductor substrate; (2) applying a silicon hard mask-forming composition on the organic underlayer film and baking the applied silicon hard mask-forming composition to form a silicon hard mask; (3) applying a resist composition onto the silicon hard mask to form a resist film; (4) exposing the resist film to light and developing the resist film after exposure to give a resist pattern; (5) etching the silicon hard mask using the resist pattern; (6) etching the organic underlayer film using the patterned silicon hard mask to form a patterned organic underlayer film; (7) applying the polysiloxane composition for coating as described in any one of the first aspect to the sixth aspect onto the patterned organic underlayer film to embed the polysiloxane composition between traces of the pattern of the organic underlayer film and exposing an upper surface of the organic underlayer film by etch back; and (8) etching the organic underlayer film to reverse the pattern.

Effects of the Invention

The polysiloxane composition for coating of the present invention is not intermixed with the patterned organic underlayer film formed on the substrate to be processed and can be excellently embedded (filled) between traces of the pattern of the organic underlayer film by applying the polysiloxane composition for coating onto the patterned organic underlayer film. The polysiloxane composition for coating is cured to form a polysiloxane composition film, and thereafter, a smooth surface can be formed by etch back by etching (gas etching). The organic underlayer film can be removed by ashing (ashing process) and thus the pattern formed in the organic underlayer film can be reversed into the pattern of the polysiloxane composition film formed by filling the polysiloxane composition for coating. By using this reversed pattern, the substrate to be processed can be processed.

When the film formed of the polysiloxane composition for coating has improved adhesion between the target substrate to be processed and a film formed on the substrate to be processed compared with the organic underlayer film, the substrate to be processed can be processed with the film having higher adhesion by using such pattern reversion.

As conventional methods, a method in which a polysiloxane-based composition is embedded (filled) between traces of a photoresist pattern and thereafter the pattern of the photoresist is reversed in the pattern of polysiloxane by etching using oxygen-based gas has been carried out. In this method, the thickness of the resist is thin and thus a reversed pattern having a high aspect ratio cannot be obtained.

In the present invention, however, pattern reversal can be carried out by using a stepped substrate having a higher aspect ratio compared with the photoresist patter on the substrate to be processed. As a result, a reversed pattern having a high aspect ratio can be obtained. In the present invention, embedding between traces of the pattern of the organic underlayer film having a high aspect ratio can be carried out and thus coating using a specific polysiloxane-based composition is effective.

As conventional methods, a method for embedding (filling) a polysiloxane-based composition between traces of the photoresist pattern has difficulty in processing such as ashing due to existence of an organic-based film at the lower layer. Consequently, the removal of the photoresist is often carried out by gas etching.

In the present invention, however, the pattern of the organic underlayer film directly disposed on the substrate to be processed or on an oxide film can be reversed using the polysiloxane-based composition and thus the pattern can be easily reversed by curing the polysiloxane-based composition after embedding the polysiloxane-based composition and carrying out ashing process.

MODES FOR CARRYING OUT THE INVENTION

Figure 1:
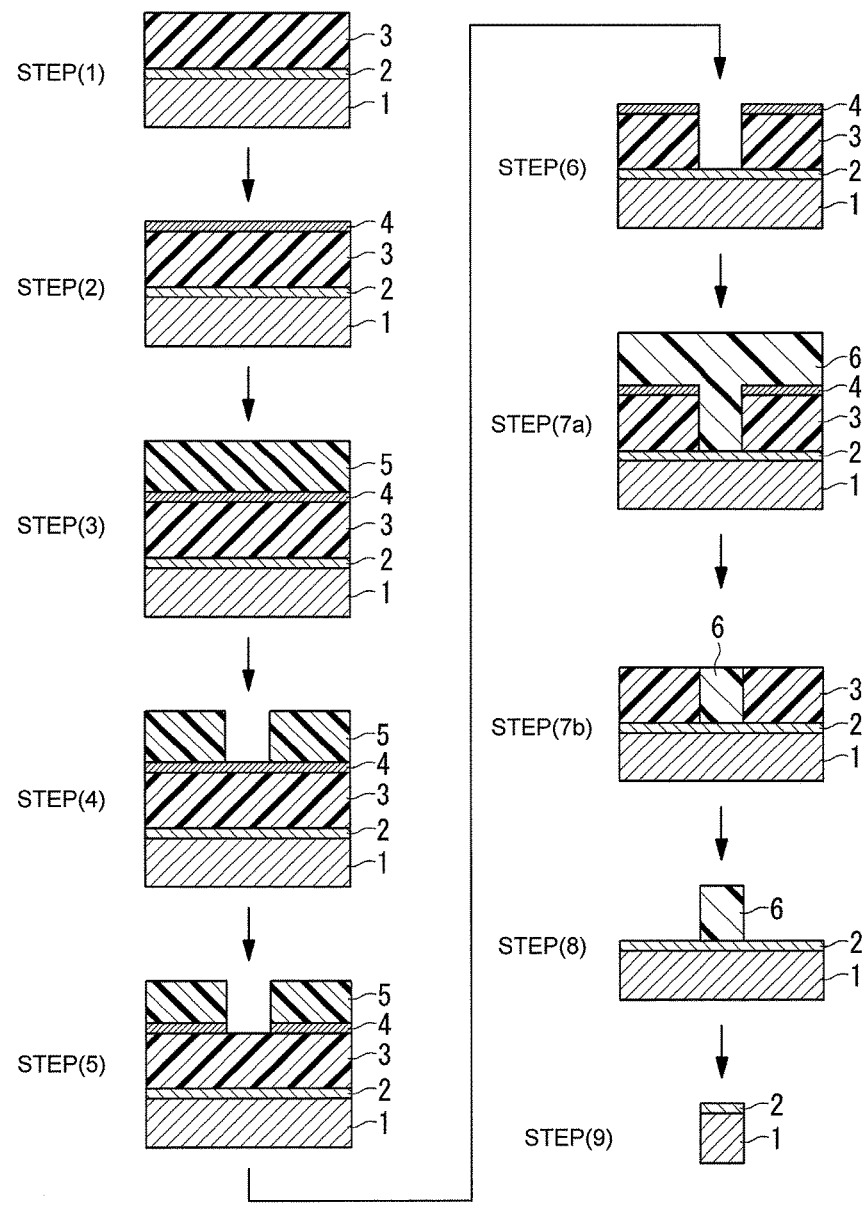
FIG. 1 is a view illustrating a method for producing a semiconductor device including a pattern reversal process using the polysiloxane composition for coating of the present invention.

The present invention includes a polysiloxane composition for coating comprising: a hydrolysis condensate of a hydrolyzable silane comprising the hydrolyzable silane having two to three hydrolyzable groups in a proportion of 30 mol % to 100 mol % in the total silanes, in which the composition is used in a method for reversing a pattern on a SOC pattern, the method comprising the steps of: (1) forming an organic underlayer film on a semiconductor substrate; (2) applying a silicon hard mask-forming composition onto the organic underlayer film and baking the applied silicon hard mask-forming composition to form a silicon hard mask; (3) applying a resist composition onto the silicon hard mask to form a resist film; (4) exposing the resist film to light and developing the resist film after exposure to give a resist pattern; (5) etching the silicon hard mask using the resist pattern; (6) etching the organic underlayer film using the patterned silicon hard mask to form a patterned organic underlayer film; (7) applying the polysiloxane composition for coating onto the patterned organic underlayer film to expose an upper surface of the organic underlayer film by etch back; and (8) etching or ashing the organic underlayer film to reverse the pattern.

In the step (7), the polysiloxane composition for coating is applied over the patterned organic underlayer film. At this time, the silicon hard mask may partially remain on the upper surface of the organic underlayer film. This is because the upper surface of the organic underlayer film is subsequently exposed by etch back of the polysiloxane for coating and thus the polysiloxane for coating and the silicon hard mask are simultaneously removed by etch back.

In the preferable polysiloxane composition of the present invention, the hydrolyzable silane is a hydrolyzable silane of Formula (1), and, in the total silanes, the hydrolyzable silane contains a hydrolyzable silane, in which a is 1 or 2, in a proportion of 30 mol % to 100 mol % and a hydrolyzable silane, in which a is 0, in a proportion of 0 mol % to 70 mol %.

Here, in Formula (1), $R^1$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, or a cyano group and bonding to a silicon atom through a Si—C bond; $R^2$ is an alkoxy group, an acyloxy group, or a halogen group; and a is an integer of 0 to 2.

The polysiloxane composition for coating of the present invention includes the hydrolysis condensate of the hydrolyzable silane of Formula (1) and a solvent. As optional components, an acid, water, an alcohol, a curing catalyst, an acid generator, another organic polymer, a light absorbable compound, and a surfactant can be included. The solid content in the polysiloxane composition for coating of the present invention is, for example, 0.1% by mass to 50% by mass, 0.1% by mass to 30% by mass, or, 0.1% by mass to 25% by mass. Here, the solid content is the content of the remaining components of the polysiloxane composition for coating formed by removing the solvent components from the whole components.

The ratio of the hydrolyzable silane, the hydrolysis product thereof, and the hydrolysis condensate thereof contained in the solid content is 20% by mass or more, and for example, 50% by mass to 100% by mass, 60% by mass to 99% by mass, or 70% by mass to 99% by mass.

The hydrolyzable silane, the hydrolysis product thereof, and the hydrolysis condensate thereof can be used as a mixture thereof. A compound formed by condensing a hydrolysis product obtained by hydrolyzing the hydrolyzable silane can be used as the condensate. A mixture of a partial hydrolysis product in which hydrolysis is not fully completed at the time of obtaining the hydrolysis condensate and the silane compound are mixed with the hydrolysis condensate can also be used. The condensate is a polymer having a polysiloxane structure.

The alkyl group is a linear or branched $C_{1-10}$ alkyl group and examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The cyclic alkyl group can also be used and examples of $C_{1-10}$ cyclic alkyl groups include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The alkenyl group is a $C_{2-10}$ alkenyl group and examples of the alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2, 3-dimethyl-3-butenyl group, 2-i-propyl-2-propenyl group, 3,3-dimethyl-1-butenyl group, 1-ethyl-1- butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and a 3-cyclohexenyl group.

The aryl group includes a $C_{6-20}$ aryl group and examples of the aryl group include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, a-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the organic group having an epoxy group include glycidoxymethyl, glycidoxyethyl, glycidoxypropyl, glycidoxybutyl, and epoxycyclohexyl.

Examples of the organic group having an acryloyl group include acryloylmethyl, acryloylethyl, and acryloylpropyl.

Examples of the organic group having a methacryloyl group include methacryloylmethyl, methacryloylethyl, and methacryloylpropyl.

Examples of the organic group having a mercapto group include ethylmercapto, butylmercapto, hexylmercapto, and octylmercapto.

Examples of the organic group having a cyano group include cyanoethyl and cyanopropyl.

The alkoxy group includes an alkoxy group having a linear, branched, or cyclic $C_{1-20}$ alkyl moiety. Examples of the alkoxy group having the linear and branched $C_{1-20}$ alkyl moiety include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the alkoxy group having the cyclic $C_{1-20}$ alkyl moiety include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

The acyloxy group includes the $C_{2-20}$ acyloxy group and examples of the acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the halogen group include fluorine, chlorine, bromine, and iodine. The examples of the groups described above are applicable to the moiety of the alkyl group, the aryl group, the alkoxy group, and the halogen group in a halogenated alkyl group, a halogenated aryl group, and an alkoxyaryl group.

In Formula (1), $R^1$ is preferably a methyl group or a phenyl group optionally having a halogen group or an alkoxy group as a substituent.

In the present invention, the polysiloxane composition for coating containing the hydrolysis condensate of the hydrolyzable silane containing the hydrolyzable silane of Formula (1) (in the formula, a is 1 or 2) in a proportion of 100 mol % in the total silanes and a crosslinkable compound having two to six methoxymethyl groups can be used.

Examples of the crosslinkable compound having two to six methoxymethyl groups include a melamine-based compound, a substituted urea-based compound, or a polymer-based compound thereof. Preferably, the crosslinkable compound is a crosslinking agent having a crosslink-forming substituent, and is a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. The condensate of these compounds can also be used. The amount of the crosslinking agent to be added varies depending on an application solvent to be used, a base substrate to be used, a required solution viscosity, and a required film shape and is 0.001% by mass to 80% by mass, preferably 0.01% by mass to 50% by mass, and further preferably 0.05% by mass to 40% by mass relative to the total solid content.

In the present invention, an acidic compound such as p-toluenesulfonic acid, trifluoromethanesulfonic acid, pyridinium p-toluenesulfonate, salicylic acid, sulfosalicylic acid, citric acid, benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and other organic sulfonic acid alkyl esters can be added as a catalyst for promoting the crosslinking reaction. The amount to be added is 0.0001% by mass to 20% by mass, preferably 0.0005% by mass to 10% by mass, and preferably 0.01% by mass to 3% by mass relative to the total solid content.

Specific examples of the hydrolysis condensate (polysiloxane) used in the present invention can be exemplified as follows.

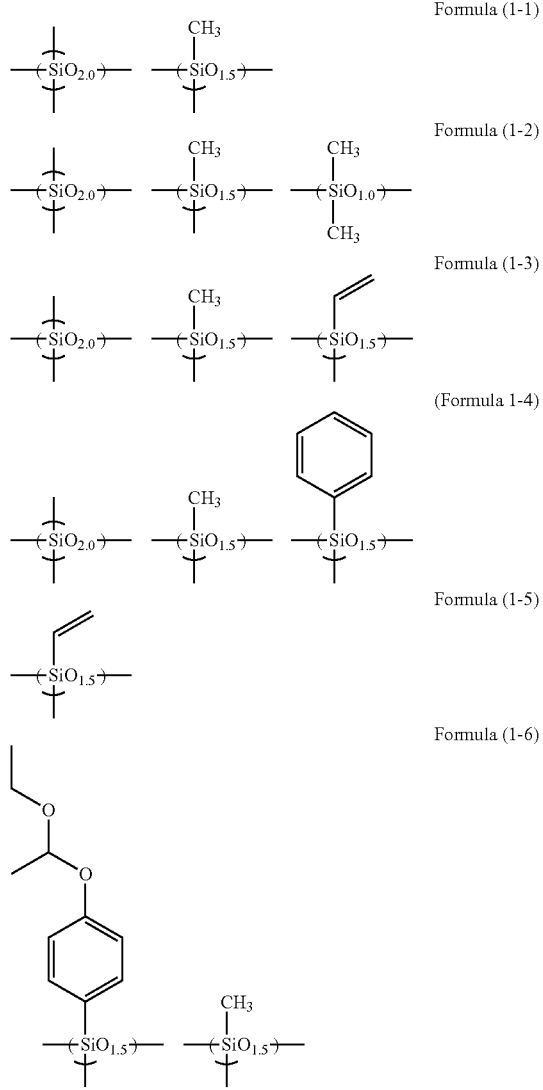

The hydrolysis condensate (polyorganosiloxane) of the hydrolyzable silane having a weight average molecular weight of 1,000 to 1,000,000, or 1,000 to 100,000 can be obtained. The molecular weight is a molecular weight obtained by GPC analysis in terms of polystyrene. For example, measurement conditions of GPC are as follows: GPC equipment (trade name HLC-8220GPC, manufactured by Tosoh Co., Ltd), GPC column (trade name Shodex KF803L, KF802, and KF801, manufactured by Showa Denko KK), Column temperature 40° C., Eluent (elution solvent) tetrahydrofuran, and Flow volume (flow rate) 1.0 ml/min. The measurement can be carried out by using polystyrene (manufactured by Showa Denko KK) as a standard sample.

For hydrolysis of alkoxysilyl groups, acyloxysilyl groups, or halogenated silyl groups, 0.5 mol to 100 mol, preferably 1 mol to 10 mol of water per 1 mol of the hydrolyzable group is used.

A hydrolysis catalyst of 0.001 mol to 10 mol and preferably 0.001 mol to 1 mol per 1 mol of the hydrolyzable group can be used.

The reaction temperature at the time of the hydrolysis and condensation is usually 20° C. to 80° C.

The hydrolysis may be complete hydrolysis or may be partial hydrolysis. In other words, a hydrolysis product or a monomer may remain in the hydrolysis condensate.

A catalyst may be used at the time of the hydrolysis and condensation.

As the hydrolysis catalyst, an acid or a base can be used. Examples of the hydrolysis catalyst include a metal chelate compound, an organic acid, an inorganic acid, an organic base, and an inorganic base.

Examples of the metal chelate compound as the hydrolysis catalyst include titanium chelate compounds such as triethoxy-mono(acetylacetonate) titanium, tri-n-propoxy-mono(acetylacetonate) titanium, tri-i-propoxy-mono(acetylacetonate) titanium, tri-n-butoxy-mono(acetylacetonate) titanium, tri-sec-butoxy-mono(acetylacetonate) titanium, tri-t-butoxy-mono(acetylacetonate) titanium, diethoxy-bis (acetylacetonate) titanium, di-n-propoxy-bis(acetylacetonate) titanium, di-i-propoxy-bis(acetylacetonate) titanium, di-n-butoxy-bis(acetylacetonate) titanium, di-sec-butoxy-bis(acetylacetonate) titanium, di-t-butoxy-bis(acetylacetonate) titanium, monoethoxy-tris(acetylacetonate) titanium, mono-n-propoxy-tris(acetylacetonate) titanium, mono-i-propoxy-tris(acetylacetonate) titanium, mono-n-butoxy-tris (acetylacetonate) titanium, mono-sec-butoxy-tris(acetylacetonate) titanium, mono-t-butoxy-tris(acetylacetonate) titanium, tetrakis(acetylacetonate) titanium, triethoxy-mono (ethyl acetoacetate) titanium, tri-n-propoxy-mono(ethyl acetoacetate) titanium, tri-i-propoxy-mono(ethyl acetoacetate) titanium, tri-n-butoxy-mono(ethyl acetoacetate) titanium, tri-sec-butoxy-mono(ethyl acetoacetate) titanium, tri-t-butoxy-mono(ethyl acetoacetate) titanium, diethoxy-bis (ethyl acetoacetate) titanium, di-n-propoxy-bis(ethyl acetoacetate) titanium, di-i-propoxy-bis(ethyl acetoacetate) titanium, di-n-butoxy-bis(ethyl acetoacetate) titanium, di-sec-butoxy-bis(ethyl acetoacetate) titanium, di-t-butoxy-bis (ethyl acetoacetate) titanium, monoethoxy-tris(ethyl acetoacetate) titanium, mono-n-propoxy-tris(ethyl acetoacetate) titanium, mono-i-propoxy-tris(ethyl acetoacetate) titanium, mono-n-butoxy-tris(ethyl acetoacetate) titanium, mono-sec-butoxy-tris(ethyl acetoacetate) titanium, mono-t-butoxy-tris(ethyl acetoacetate) titanium, tetrakis(ethyl acetoacetate) titanium, mono(acetylacetonate)-tris(ethyl acetoacetate) titanium, bis (acetylacetonate)-bis(ethyl acetoacetate) titanium, and tris(acetylacetonate)-mono(ethyl acetoacetate) titanium; zirconium chelate compounds such as triethoxy-mono(acetylacetonate) zirconium, tri-n-propoxy-mono(acetylacetonate) zirconium, tri-i-propoxy-mono(acetylacetonate) zirconium, tri-n-butoxy-mono (acetylacetonate) zirconium, tri-sec-butoxy-mono (acetylacetonate) zirconium, tri-t-butoxy-mono (acetylacetonate) zirconium, diethoxy-bis(acetylacetonate) zirconium, di-n-propoxy-bis(acetylacetonate) zirconium, di-i-propoxy-bis(acetylacetonate) zirconium, di-n-butoxy-bis (acetylacetonate) zirconium, di-sec-butoxy-bis(acetylacetonate) zirconium, di-t-butoxy-bis(acetylacetonate) zirconium, monoethoxy-tris(acetylacetonate) zirconium, mono-n-propoxy-tris(acetylacetonate) zirconium, mono-i-propoxy-tris(acetylacetonate) zirconium, mono-n-butoxy-tris(acetylacetonate) zirconium, mono-sec-butoxy-tris (acetylacetonate) zirconium, mono-t-butoxy-tris (acetylacetonate) zirconium, tetrakis(acetylacetonate) zirconium, triethoxy-mono(ethyl acetoacetate) zirconium, tri-n-propoxy-mono(ethyl acetoacetate) zirconium, tri-i-propoxy-mono(ethyl acetoacetate) zirconium, tri-n-butoxy-mono(ethyl acetoacetate) zirconium, tri-sec-butoxy-mono (ethyl acetoacetate) zirconium, tri-t-butoxy-mono(ethyl acetoacetate) zirconium, diethoxy-bis(ethyl acetoacetate) zirconium, di-n-propoxy-bis(ethyl acetoacetate) zirconium, di-i-propoxy-bis(ethyl acetoacetate) zirconium, di-n-butoxy-bis(ethyl acetoacetate) zirconium, di-sec-butoxy-bis (ethyl acetoacetate) zirconium, di-t-butoxy-bis(ethyl acetoacetate) zirconium, monoethoxy-tris(ethyl acetoacetate) zirconium, mono-n-propoxy-tris(ethyl acetoacetate) zirconium, mono-i-propoxy-tris(ethyl acetoacetate) zirconium, mono-n-butoxy-tris(ethyl acetoacetate) zirconium, mono-sec-butoxy-tris(ethyl acetoacetate) zirconium, mono-t-butoxy-tris(ethyl acetoacetate) zirconium, tetrakis(ethyl acetoacetate) zirconium, mono(acetylacetonate)-tris(ethyl acetoacetate) zirconium, bis(acetylacetonate)-bis(ethyl acetoacetate) zirconium, and tris(acetylacetonate)-mono (ethyl acetoacetate) zirconium, and aluminum chelate compounds such as tris(acetylacetonate) aluminum and tris(ethyl acetoacetate) aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethyl-monoethanolamine, monomethyl-diethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, the metal chelate compound, the organic acid, and the inorganic acid are preferable, and the catalysts may be used singly or in combination of two or more of them.

Examples of the organic solvent used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol-based solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; polyalcohol-based solvents such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone-based solvents such as acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether-based solvents such as ethyl ether, i-propyl ether, n-butyl ether, n-hexyl ether, 2-ethylhexyl ether, ethylene oxide, 1,2-propylene oxide, dioxolane, 4-methyl-dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester-based solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methxoybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol di-acetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing-based solvents such as N-methylformamide, N,N-dimethylformamide, N,N-diethylformamide, acetamide, N-methylacetamide, N,N-dimethylacetamide, N-methyl-propionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents can be used singly or in combination of two or more of them.

Particularly the following ketone-based solvents are preferably from the viewpoint of storage stability of the obtained solution: acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonylacetone, diacetone alcohol, acetophenone, and fenchone.

The polysiloxane composition for coating of the present invention may include a curing catalyst. The curing catalyst acts as a curing catalyst when a coating film containing a polyorganosiloxane made of the hydrolysis condensate is heated and cured.

Examples of the usable curing catalyst include ammonium salts, phosphines, phosphonium salts, and sulfonium salts.

Examples of the ammonium salts include a tertiary ammonium salt having a structure of Formula (D-1):

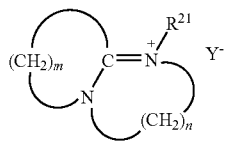

Formula (D-1)

(where m is an integer of 2 to 11; n is an integer of 2 or 3; $R^{21}$ is an alkyl group or an aryl group; and $Y^-$ is an anion), a quaternary ammonium salt having a structure of Formula (D-2):

$$R^{22}R^{23}R^{24}R^{25}N^+Y^-$$ Formula (D-2)

(where $R^{22}$, $R^{23}$, $R^{24}$, and $R^{25}$ are alkyl groups or aryl groups; N is a nitrogen atom, $Y^-$ is an anion; and $R^{22}$, $R^{23}$, $R^{24}$, and $R^{25}$ each are bonded to the nitrogen atom through a C—N bond), a quaternary ammonium salt having a structure of Formula (D-3):

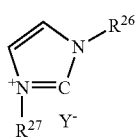

Formula (D-3)

(where $R^{26}$ and $R^{27}$ are alkyl groups or aryl groups, and $Y^-$ is an anion), a quaternary ammonium salt having a structure of Formula (D-4):

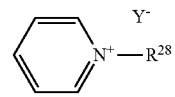

Formula (D-4)

(where $R^{28}$ is an alkyl group or an aryl group, and $Y^-$ is an anion), a quaternary ammonium salt having a structure of Formula (D-5):

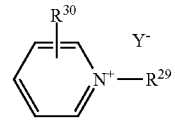

Formula (D-5)

(where $R^{29}$ and $R^{30}$ are alkyl groups or aryl groups, and $Y^-$ is an anion), and a quaternary ammonium salt having a structure of Formula (D-6):

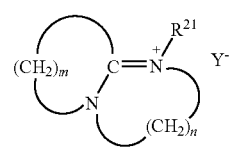

Formula (D-6)

(where m is an integer of 2 to 11; n is an integer of 2 or 3; H is a hydrogen atom; and $Y^-$ is an anion).

Examples of the phosphonium salts include a quaternary phosphonium salt of Formula (D-7):

$$R^{31}R^{32}R^{33}R^{34}P^+Y^-$$ (D-7)

(where $R^{31}$, $R^{32}$, $R^{33}$, and $R^{34}$ are alkyl groups or aryl groups; P is a phosphorus atom; $Y^-$ is an anion, and $R^{31}$, $R^{32}$, $R^{33}$, and $R^{34}$ each are bonded to the phosphorus atom through a C—P bond).

Examples of the sulfonium salts include a tertiary sulfonium salt of Formula (D-8):

$$R^{35}R^{36}R^{37}S^+Y^-$$ Formula (D-8)

(where $R^{35}$, $R^{36}$, and $R^{37}$ are alkyl groups or aryl groups; S is a sulfur atom; $Y^-$ is an anion, and $R^{35}$, $R^{36}$, and $R^{37}$ each are bonded to the sulfur atom through a C—S bond).

The compound of Formula (D-1) is a quaternary ammonium salt derived from an amine. m is an integer of 2 to 11 and n is an integer of 2 or 3. $R^{21}$ in the quaternary ammonium salt is a $C_{1-18}$ alkyl group or aryl group and preferably a $C_{2-10}$ alkyl group or aryl group. Examples of $R^{21}$ include linear alkyl groups such as ethyl group, propyl group, and butyl group; and benzyl group, cyclohexyl group, cyclohexylmethyl group, and di-cyclopentadienyl group. Examples of the anion ($Y^-$) include halogen ions such as chlorine ion ($Cl^-$), bromide ion ($Br^-$), and iodide ion ($I^-$); and acid groups such as carboxylate (—COO$^-$), sulfonate (—SO$_3^-$), and alcoholate (—O$^-$).

The compound of Formula (D-2) is a quaternary ammonium salt of $R^{22}R^{23}R^{24}R^{25}N^+Y^-$. $R^{22}$, $R^{23}$, $R^{24}$, and $R^{25}$ in the quaternary ammonium salt are $C_{1-18}$ alkyl groups or aryl groups, or silane compounds bonding to a silicon atom through a Si—C bond. Examples of the anion ($Y^-$) include halogen ions such as chlorine ion ($Cl^-$), bromide ion ($Br^-$), and iodide ion ($I^-$); and acid groups such as carboxylate (—COO$^-$), sulfonate (—SO$_3^-$), and alcoholate (—O$^-$). The quaternary ammonium salt is commercially available and examples of the quaternary ammonium salt include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. $R^{26}$ and $R^{27}$ are C$_{1-18}$ alkyl groups or aryl groups. The total carbon atoms of $R^{26}$ and $R^{27}$ are preferably 7 or more. Examples of $R^{26}$ include methyl group, ethyl group, propyl group, phenyl group, and benzyl group and examples of $R^{27}$ include benzyl group, octyl group, and octadecyl group. Examples of the anion (Y$^-$) include halogen ions such as chlorine ion (Cl$^+$), bromide ion (Br$^-$), and iodide ion (I$^-$); and acid groups such as carboxylate (—COO$^-$), sulfonate (—SO$_3^-$), and alcoholate (—O$^-$). The compound is commercially available, or can be manufactured by reacting, for example, an imidazole-based compound such as 1-methylimidazole and 1-benzylimidazole with a halogenated alkyl or a halogenated aryl such as benzyl bromide and methyl bromide.

The compound of Formula (D-4) is a quaternary ammonium salt derived from pyridine. $R^{28}$ is a C$_{1-18}$ alkyl group or aryl group and preferably a C$_{4-18}$ alkyl group or aryl group. Examples of $R^{28}$ include butyl group, octyl group, benzyl group, and lauryl group. Examples of the anion (Y$^-$) include halogen ions such as chlorine ion (Cl$^-$), bromide ion (Br$^-$), and iodide ion (I$^-$); and acid groups such as carboxylate (—COO$^-$), sulfonate (—SO$_3^-$), and alcoholate (—O$^-$). The compound is commercially available, or can be manufactured by reacting, for example, pyridine with a halogenated alkyl or a halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (D-5) is a quaternary ammonium salt derived from a substituted pyridine as represented by picoline and the like. $R^{29}$ is a C$_{1-18}$ alkyl group or aryl group and preferably a C$_{4-18}$ alkyl group or aryl group. Examples of $R^{29}$ include methyl group, octyl group, lauryl group, and benzyl group. $R^{30}$ is a C$_{1-18}$ alkyl group or aryl group. For example, $R^{30}$ is a methyl group when the compound is a quaternary ammonium derived from picoline. Examples of the anion (Y$^-$) include halogen ions such as chlorine ion (Cl$^-$), bromide ion (Br$^-$), and iodide ion (I$^-$); and acid groups such as carboxylate (—COO$^-$), sulfonate (—SO$_3^-$), and alcoholate (—O$^-$). The compound is commercially available, or can be manufactured by reacting, for example, a substituted pyridine such as picoline with a halogenated alkyl or a halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (D-6) is a tertiary ammonium salt derived from an amine. m is an integer of 2 to 11 and n is an integer of 2 or 3. Examples of the anion (Y$^-$) include halogen ions such as chlorine ion (Cl$^-$), bromide ion (Br$^-$), and iodide ion (I$^-$); and acid groups such as carboxylate (—COO$^-$), sulfonate (—SO$_3^-$), and alcoholate (—O$^-$). The compound can be produced by reacting an amine with a weak acid such as a carboxylic acid and phenol. Examples of the carboxylic acid include formic acid and acetic acid. When formic acid is used, the anion (Y$^-$) is (HCOO$^-$), and when acetic acid is used, the anion (Y$^-$) is (CH$_3$COO$^-$). When phenol is used, the anion (Y$^-$) is (C$_6$H$_5$O$^-$).

The compound of Formula (D-7) is a quaternary phosphonium salt having a structure of $R^{31}R^{32}R^{33}R^{34}P^+Y^-$. $R^{31}$, $R^{32}$, $R^{33}$, and $R^{34}$ are C$_{1-18}$ alkyl groups or aryl groups, or silane compounds bonding to a silicon atom through a Si—C bond. Preferably three out of the four substituents of $R^{31}$ to $R^{34}$ are phenyl groups or substituted phenyl groups, and examples of the phenyl groups or substituted phenyl groups include phenyl group and tolyl group. Remaining one substituent is a C$_{1-18}$ alkyl group or aryl group, or a silane compound bonding to a silicon atom through a Si—C bond. Examples of the anion (Y$^-$) include halogen ions such as chlorine ion (Cl$^-$), bromide ion (Br$^-$), and iodide ion (I$^-$); and acid groups such as carboxylate (—COO$^-$), sulfonate (—SO$_3^-$), and alcoholate (—O$^-$). The compound is commercially available and examples of the compound include halogenated tetraalkylphosphoniums such as halogenated tetra-n-butylphosphoniums and halogenated tetra-n-propylphosphoniums; halogenated trialkylbenzylphosphoniums such as halogenated triethylbenzylphosphoniums; halogenated triphenyl-mono-alkylphosphoniums such as halogenated triphenylmethylphosphoniums and halogenated triphenylethylphosphoniums; halogenated triphenylbenzylphosphoniums, halogenated tetraphenylphosphoniums, halogenated tritolyl-mono-arylphosphoniums, and halogenated tritolyl-mono-alkylphosphoniums (the halogen atom is a chlorine atom or a bromine atom). Particularly preferable examples include halogenated triphenyl-mono-alkylphosphoniums such as halogenated triphenylmethylphosphoniums and halogenated triphenylethylphosphoniums; halogenated triphenyl-mono-arylphosphoniums such as halogenated triphenylbenzylphosphoniums; halogenated tritolyl-mono-arylphosphoniums such as halogenated tritolyl-mono-phenylphosphoniums; and halogenated tritolyl-mono-alkylphosphoniums such as halogenated tritolyl-mono-methylphosphoniums (the halogen atom is a chlorine atom or a bromine atom).

Examples of the phosphines include primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (D-8) is a tertiary sulfonium salts having a structure of $R^{35}R^{36}R^{37}S^+Y^-$. $R^{35}$, $R^{36}$, and $R^{37}$ are C$_{1-18}$ alkyl groups or aryl groups, or silane compounds bonding to a silicon atom through a Si—C bond. Preferably three out of the four substituents of $R^{35}$ to $R^{37}$ are phenyl groups or substituted phenyl groups, and examples of the phenyl groups or substituted phenyl groups include phenyl group and tolyl group. Remaining one substituent is a C$_{1-18}$ alkyl group or aryl group. Examples of the anion (Y$^-$) include halogen ions such as chlorine ion (Cl$^-$), bromide ion (Br$^-$), and iodide ion (I$^-$); and acid groups such as carboxylate (—COO$^-$), sulfonate (—SO$_3^-$), alcoholate (—O$^-$), maleic acid anion, and nitric acid anion. The compound is commercially available and examples of the compound include halogenated tetraalkylsulfoniums such as halogenated tri-n-butylsulfoniums and halogenated tri-n-propylsulfoniums; halogenated trialkylbenzylsulfoniums such as halogenated diethylbenzylsulfoniums; halogenated diphenyl-mono-alkyl sulfoniums such as halogenated diphenylmethylsulfoniums and halogenated diphenylethylsulfoniums; halogenated triphenylsulfoniums (the halogen atom is a chlorine atom or a bromine atom); tetraalkylphosphonium carboxylates such as tri-n-butylsulfonium carboxylate and tri-n-propylsulfonium carboxylate; trialkylbenzylsulfonium carboxylates such as diethylbenzylsulfonium carboxylate; diphenyl-mono-alkylsulfonium carboxylates such as diphenylmethylsulfonium carboxylate and diphenylethylsulfonium carboxylate; and triphenylsulfonium carboxylate. Particularly, halogenated triphenylsulfoniums and triphenylsulfonium carboxylate are preferably used.

In the present invention, a nitrogen-containing silane compound can be added as the curing catalyst. Examples of the nitrogen-containing silane compound include imidazole ring-containing silane compounds such as N-(3-triethoxysilylpropyl)-4,5-dihydroimidazole.

The amount of the curing catalyst is 0.01 part by mass to 10 parts by mass, 0.01 part by mass to 5 parts by mass, or 0.01 part by mass to 3 parts by mass per 100 parts by mass of the polyorganosiloxane.

The hydrolyzable silane is hydrolyzed and condensed in the solvent using the catalyst, and alcohols as by-products, the hydrolysis catalyst used, and water used can be simultaneously removed from the obtained hydrolysis condensate (a polymer) by distillation under reduced pressure or other operations. The acid and the base used for the hydrolysis can be removed by neutralization or ion exchange. To the polysiloxane composition for coating of the present invention, an organic acid, water, an alcohol, or a combination thereof can be added in order to stabilize the polysiloxane composition for coating including the hydrolysis condensate of the hydrolyzable silane.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid, or the like are preferable. The amount of the organic acid to be added is 0.1 part by mass to 5.0 parts by mass per 100 parts by mass of the condensate (polyorganosiloxane). As the water to be added, ultrapure water, ion-exchanged water, or the like can be used. The amount of the water to be added can be 1 part by mass to 20 parts by mass per 100 parts by mass of the polysiloxane composition for coating.

As the alcohol to be added, an alcohol that is easily evaporated by heating after application is preferable. Examples of the alcohol include methanol, ethanol, propanol, isopropanol, and butanol. The amount of the alcohol to be added can be 1 part by mass to 20 parts by mass per 100 parts by mass of the resist underlayer film-forming composition.

Consequently, the polysiloxane composition for coating can contain one or more of substances selected from the group consisting of the water, the acid, and the curing catalyst.

Other than the above components, the polysiloxane composition for coating of the present invention may include, for example, an organic polymer compound, a photoacid generator, and a surfactant, if necessary.

Use of the organic polymer compound allows a dry etching rate (a decreased amount in film thickness per unit time), a damping coefficient, and a refractive index of the resist underlayer film formed from the polysiloxane composition for coating of the present invention to be adjusted.

Examples of the photoacid generator included in the polysiloxane composition for coating of the present invention include onium salt compounds, sulfonimide compounds, and disulfonyldiazomethane compounds.

Examples of the onium salt compounds include iodonium salt compounds such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonim camphorsulfonate, and bis(4-tert-butylphenyl) iodonium trifluoromethanesulfonate; and sulfonium salt compounds such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Examples of the sulfonimide compound include N-(trifluoromethanesulfonyloxy) succinimide, N-(nonafluoro-normal-butanesulfonyloxy) succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photoacid generator can be used singly or can be used in combination of two or more of them.

When the photoacid generator is used, a ratio thereof is 0.01 part by mass to 15 parts by mass, 0.1 part by mass to 10 parts by mass, or 0.5 part by mass to 1 part by mass per 100 parts by mass of the condensate (polyorganosiloxane).

A surfactant is effective for reducing generation of pinholes and striations when the polysiloxane composition for coating of the present invention is applied to the substrate.

Examples of the surfactant included in the polysiloxane composition for coating of the present invention include nonionic surfactant such as polyoxyethylene alkyl ethers including polyoxyethylene lauryl ethers, polyoxyethylene stearyl ethers, polyoxyethylene cetyl ethers, and polyoxyethylene oleyl ethers; polyoxyethylene alkylallyl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as Eftop EF301, EF303, and EF352 (trade name, manufactured by TOHKEM PRODUCTS CORPORATION), Megafac F171, F173, R-08, R-30, R-30N, and R-40LM (trade name, manufactured by DIC Corporation), Fluorad FC430 and FC431 (trade name, manufactured by Sumitomo 3M Ltd.), Asahi guard AG710, Surflon S-382, SC101, SC102, SC103, SC104, SC105, and SC106 (trade name, Asahi Glass Co., Ltd.); and Organosiloxane Polymer KP341 (manufactured by Shin-Etsu Chemical Co., Ltd.). These surfactants can be used singly or can be used in combination of two or more of them. When the surfactant is used, the ratio thereof is 0.0001 part by mass to 5 parts by mass, 0.001 part by mass to 1 part by mass, or 0.01 part by mass to 1 part by mass per 100 parts by mass of the condensate (polyorganosiloxane).

The polysiloxane composition for coating of the present invention can also contain, for example, a rheology modifier and an adhesion assistance agent. The rheology modifier is effective for improving flowability of the underlayer film-forming composition. The adhesion assistance agent is effective for improving adhesion of the underlayer film and the semiconductor substrate or the resist.

As a solvent used for the polysiloxane composition for coating of the present invention, any solvent can be used without limitation as long as the solvent can dissolve the solid content. Examples of the solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methyl propionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methyl propionate, methyl 3-methoxy-2-methyl propionate, methyl 2-hydroxy-3-methyl butyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methy-2-pentanol, and γ-butyrolactone. These solvents can be used singly or in combination of two or more of them.

Hereinafter, one example of the method for producing semiconductor devices including the pattern reversal process using the polysiloxane composition for coating of the present invention will be described using FIG. 1. In FIG. 1, a semiconductor substrate 1 is a wafer and a semiconductor substrate 2 is an oxide film or a metal layer deposited on the semiconductor substrate 1.

As illustrated in FIG. 1, an organic underlayer film 3 is formed on the semiconductor substrate 2 (Step (1)); a silicon hard mask-forming composition is applied onto the organic underlayer film 3 and the applied silicon hard mask-forming composition is baked to form a silicon hard mask 4 (Step (2)); and a resist composition is applied onto the silicon hard mask 4 to form a resist film 5 (Step (3)). The resist film 5 is exposed to light and the resist film 5 after exposure is developed to give a resist pattern (Step (4)). The silicon hard mask 4 is etched using the resist pattern and the organic underlayer film 3 is etched using the patterned silicon hard mask 4 (Step (5)) and the patterned organic underlayer film 3 is formed (Step (6)). The polysiloxane composition for coating of the present invention is applied over the patterned organic underlayer film 3 to form a polysiloxane composition film 6 in which the composition is embedded between traces of the pattern of the organic underlayer film 3 (Step (7a)) and the upper surface of the organic underlayer film 3 is exposed by etch back (Step (7b)). The organic underlayer film 3 is etched to reverse the pattern (Step (8)). The substrates 1 and 2 are processed using the reversed pattern (Step (9)) to produce the semiconductor device made of the processed substrates 1 and 2.

The organic underlayer film 3 used in the present invention can be obtained by applying an organic underlayer film-forming composition and curing the applied organic underlayer film-forming composition. The curing can be carried out by heating at about 150° C. to 230° C. The organic underlayer film-forming composition can contain a coating resin and a solvent. The organic underlayer film-forming composition can further contain a crosslinking agent, an acid, an acid generator, a light absorption compound, and the like. The coating resin is a resin that can mainly form a film. Examples of the coating resin include a novolac resin, a condensation epoxy-based resin, a (meth)acrylic resin, a polyether-based resin, or a silicon-containing resin. The solid content of the composition is 0.1% by mass to 70% by mass or 0.1% by mass to 60% by mass. The solid content is the content ratio of the remaining components of the film-forming composition formed by removing the solvent from the film-forming composition. In the solid content, the coating resin can be contained in a ratio of 1% by mass to 99.9% by mass, 50% by mass to 99.9% by mass, 50% by mass to 95% by mass, or 50% by mass to 90% by mass. The coating resin has a weight average molecular weight of 600 to 1,000,000 or 600 to 200,000.

The silicon hard mask 4 used in the present invention is obtained by applying the silicon hard mask-forming composition and curing the applied silicon hard mask-forming composition. Examples of the constituent of the composition include a condensate obtained by hydrolyzing the hydrolyzable silane. The constituent described here is a polysiloxane and also includes an organopolysiloxane. The hydrolyzable silane can be obtained by hydrolyzing at least one hydrolyzable silane selected from the group consisting of a hydrolyzable silane having four hydrolyzable groups, a hydrolyzable silane having three hydrolyzable groups, a hydrolyzable silane having two hydrolyzable groups, and a hydrolyzable silane having one hydrolyzable group. The hydrolysis is carried out by adding a catalyst (for example, an acid catalyst or a basic catalyst) in an organic solvent and thereafter condensation is carried out by heating to give the hydrolysis condensate (polysiloxane and organopolysiloxane). The solid content of the composition is 0.1% by mass to 70% by mass or 0.1% by mass to 60% by mass. The solid content is the content ratio of the remaining components of the film-forming composition formed by removing the solvent form the film-forming composition. In the solid content, the coating resin may be contained in a ratio of 1% by mass to 99.9% by mass, 50% by mass to 99.9% by mass, 50% by mass to 95% by mass, or 50% by mass to 90% by mass. The coating resin has a weight average molecular weight of 600 to 1,000,000 or 600 to 200,000.

The silicon hard mask 4 can also be formed by vacuum evaporation.

In the present invention, the composition used in the present invention is applied onto the substrate 1 (for example, a silicon wafer substrate, a silicon/silicon dioxide coated substrate, a silicon nitride substrate, a glass substrate, an ITO substrate, a polyimide substrate, and a low dielectric constant material (low-k material) coated substrate) used in the manufacture of semiconductor devices by using an appropriate coating method such as a spinner or a coater.

A film is formed by baking the applied composition used in the present invention. The baking conditions are appropriately selected from a baking temperature of 80° C. to 250° C. and a baking time of 0.3 minute to 60 minutes. The preferable conditions are a baking temperature of 150° C. to 250° C. and a baking time of 0.5 minute to 2 minutes. The film thickness of the film to be formed is, for example, 10 nm to 1,000 nm, 20 nm to 500 nm, 50 nm to 300 nm, or 100 nm to 200 nm.

On the hard mask 4, for example, a photoresist layer (film) 5 is formed. The photoresist layer (film) 5 can be formed by a known method, that is, applying a photoresist composition solution onto the underlayer film and baking the applied photoresist composition. The thickness of the photoresist layer (film) 5 is, for example, 50 nm to 10,000 nm, 100 nm to 2,000 nm, or 200 nm to 1,000 nm.

In the present invention, after the organic underlayer film 3 is formed on the substrate, the hard mask 4 is formed on the organic underlayer film 3 and a photoresist film 5 can be further formed on the hard mask 4. These processes allow a photoresist pattern to have a narrow width. Even when the photoresist is thinly applied in order to prevent the pattern collapse, the substrate can be processed by appropriately selecting an etching gas. For example, the hard mask 4 can be processed by using the fluorine-based gas as the etching gas, in which the hard mask 4 has a sufficiently higher etching rate than the photoresist film 5. The organic underlayer film 3 can be processed by using an oxygen-based gas as the etching gas, in which the organic underlayer film 3 has a sufficiently higher etching rate than the hard mask 4. Further, the substrate can be processed by reversing the pattern.

The photoresist is not limited as long as the photoresist is sensitive to the light used for exposure. Both a negative type photoresist and a positive type photoresist can be used. Examples of the photoresist include a positive type photoresist made of a novolac resin and 1,2-naphthoquinone diazide sulfonic acid ester, a chemically amplified photoresist made of a binder having a group decomposed with an acid to increase an alkali dissolution rate and a photoacid generator, a chemically amplified photoresist made of a low molecular compound decomposed with an acid to increase an alkali dissolution rate, an alkali-soluble binder, and a photoacid generator, and a chemically amplified photoresist made of a binder having a group decomposed with an acid to increase an alkali dissolution rate, a low molecular compound decomposed with an acid to increase an alkali dissolution rate of a photoresist, and a photoacid generator. Examples of commercially available photoresists include APEX-E (trade name, manufactured by Shipley Company L. L. C.), PAR710 (trade name, Sumitomo Chemical Company, Limited), and SEPR430 (trade name, manufactured by Shin-Etsu Chemical Co., Ltd.). In addition, fluorine atom-containing polymer-based photoresists as described in Proc. SPIE, Vol. 3999, 330-334 (2000), Proc. SPIE, Vol. 3999, 357-364 (2000), and Proc. SPIE, Vol. 3999, 365-374 (2000) can be included.

Subsequently, exposure to light is carried out through the predetermined mask. A KrF excimer laser (a wavelength of 248 nm), an ArF excimer laser (a wavelength of 193 nm), and an $F_2$ excimer laser (a wavelength of 157 nm) can be used for the exposure. After exposure, post exposure bake can be carried out, if necessary. The post exposure baking is carried out under appropriately selected conditions of a heating temperature of 70° C. to 150° C. and a heating time of 0.3 minute to 10 minutes.

In the present invention, a resist for electron beam lithography or a resist for EUV lithography can be used as a resist instead of the photoresist. Both a negative type electron beam resist and a positive type electron beam resist can be used. Examples of the electron beam resist include a chemically amplified resist made of an acid generator and a binder having a group decomposed with an acid to change an alkali dissolution rate, a chemically amplified resist made of an alkali soluble binder, an acid generator, and a low molecular compound decomposed with an acid to change an alkali dissolution rate, a chemically amplified resist made of an acid generator, a binder having a group decomposed with an acid to change an alkali dissolution rate, and a low molecular compound decomposed with an acid to change an alkali dissolution rate, a non-chemically amplified resist made of a binder having a group decomposed with electron beams to change an alkali dissolution rate, and a non-chemically amplified resist made of a binder having a site the chemical bond of which is cut by electron beams to change an alkali dissolution rate. When these electron beam resists are used, similar to the case where photoresist is used, a resist pattern can be formed by using electron beams as an irradiation source.

As the EUV resist, a methacrylate resin-based resist, a methacrylate-polyhydroxystyrene hybrid resin-based resist, and a polyhydroxystyrene resin-based resist can be used. Both a negative type EUV resist and a positive type EUV resist can be used. Examples of the EUV resist include a chemically amplified resist made of an acid generator and a binder having a group decomposed with an acid to change an alkali dissolution rate, a chemically amplified resist made of an alkali soluble binder, an acid generator, and a low molecular compound decomposed with an acid to change an alkali dissolution rate, a chemically amplified resist made of an acid generator, a binder having a group decomposed with an acid to change an alkali dissolution rate, and a low molecular compound decomposed with an acid to change an alkali dissolution rate, a non-chemically amplified resist made of a binder having a group decomposed with EUV light to change an alkali dissolution rate, and a non-chemically amplified resist made of a binder having a site the chemical bond of which is cut by EUV light.

Subsequently, development is carried out with a development solution (for example, an alkali solution). This allows an exposed part of the photoresist to be removed to form the pattern of the photoresist when, for example, a positive type photoresist is used. Examples of the development solution include aqueous alkali solutions including aqueous solutions of alkali metal hydroxides such as potassium hydroxide and sodium hydroxide, aqueous solutions of quaternary ammoniums such as tetramethylammonium hydroxide, tetraethylammonium hydroxide, and choline, and aqueous solutions of amines such as ethanolamine, propylamine, and ethylenediamine. In addition, a surfactant and the like can be added to the development solution. The development conditions are appropriately selected from a temperature of 5° C. to 50° C. and a time of 10 seconds to 600 seconds.

In the present invention, organic solvents can be used as the development solution. After exposure to light, development is carried out with a development solution (a solvent). This allows an unexposed part of the photoresist to be removed to form a pattern of the photoresist when, for example, a positive type photoresist is used.

Examples of the development solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. In addition, a surfactant and the like can be added to the development solution. The development conditions are appropriately selected from a temperature of 5° C. to 50° C. and a time of 10 seconds to 600 seconds.

The hard mask 4 is removed using the pattern of thus formed photoresist (upper layer) film 5 as a protection film. Subsequently, the organic underlayer film 3 (lower layer) is removed using the patterned photoresist film 5 and the film 4 made of the hard mask as protection films. Finally, the polysiloxane composition for coating is applied over the patterned organic underlayer film 3 to form the polysiloxane composition film 6 in which the polysiloxane composition is embedded between traces of the pattern of the organic underlayer film 3. The upper surface of the organic underlayer film 3 is exposed by etch back and the pattern is reversed by etching the organic underlayer film 3.

First, the part of the hard mask 4 where the photoresist film 5 is removed is removed by dry etching to expose the upper surface of the organic underlayer film 3. Examples of gases to be used for dry etching of the hard mask 4 include tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane and dichloroborane. The hard mask 4 is preferably dry-etched by using the halogen-based gas. The photoresist made of organic substances is basically difficult to be removed by the dry etching using the halogen-based gas. On the contrary, the hard mask that contains many silicon atoms is rapidly removed by using the halogen-based gas. Therefore, reduction in the film thickness of the photoresist film 5 associated with the dry etching of the hard mask can be reduced. As a result, the photoresist can be used as a thin film. Dry etching of the hard mask is preferably carried out by a fluorine-based gas. Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Thereafter, the organic underlayer film 3 is removed by using the patterned photoresist film 5 and the film 4 made of the hard mask as the protective films. The organic underlayer film 3 (lower layer) is preferably dry-etched by using an oxygen-based gas. This is because the resist hard mask 4 that contains many silicon atoms is difficult to be removed by dry etching with the oxygen-based gas.

The fluorine gas is used as the gas used in etch back in the process of applying the polysiloxane composition for coating onto the patterned organic underlayer film 3 to form the polysiloxane composition film 6 embedding the composition between traces of the pattern of the organic underlayer film 3 and exposing the upper surface of the organic underlayer film 3 by the etch back. Then, the pattern can be reversed by etching or ashing the organic underlayer film 3.

EXAMPLES

Synthesis Example 1

Into a flask, 116.15 g (contained in a ratio of 70 mol % in the total silanes) of tetraethoxysilane, 42.60 g (contained in a ratio of 30 mol % in the total silanes) of methyltriethoxysilane, and 238.14 g of acetone were charged. Into this flask, a dropping funnel equipped with a condenser and containing 53.11 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-1)). Further, acetone was replaced with propylene glycol monomethyl ether acetate by using the evaporator. As a result of measurement by a calcination method, the solid content in the obtained reaction product was 22.18% by mass. The molecular weight (Mw) of the obtained product (solid content) was 1,400. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 2

Into a flask, 101.23 g (contained in a ratio of 60 mol % in the total silanes) of tetraethoxysilane, 57.76 g (contained in a ratio of 40 mol % in the total silanes) of methyltriethoxysilane, and 238.48 g of acetone were charged. Into this flask, a dropping funnel equipped with a condenser and containing 52.54 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-1)). Further, acetone was replaced with propylene glycol monomethyl ether acetate by using the evaporator. As a result of measurement by a calcination method, the solid content in the obtained reaction product was 18.39% by mass. The molecular weight (Mw) of the obtained product (solid content) was 1,400. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 3

Into a flask, 85.79 g (contained in a ratio of 50 mol % in the total silanes) of tetraethoxysilane, 73.43 g (contained in a ratio of 50 mol % in the total silanes) of methyltriethoxysilane, and 238.83 g of acetone were charged. Into this flask, a dropping funnel equipped with a condenser and containing 51.95 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-1)). Further, acetone was replaced with propylene glycol monomethyl ether acetate by using the evaporator. As a result of measurement by a calcination method, the solid content in the obtained reaction product was 24.16% by mass. The molecular weight (Mw) of the obtained product (solid content) was 1,400. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 4

Into a flask, 69.83 g (contained in a ratio of 40 mol % in the total silanes) of tetraethoxysilane, 89.64 g (contained in a ratio of 60 mol % in the total silanes) of methyltriethoxysilane, and 239.20 g of acetone were charged. Into this flask, a dropping funnel equipped with a condenser and containing 51.34 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-1)). Further, acetone was replaced with propylene glycol monomethyl ether acetate by using the evaporator. As a result of measurement by a calcination method, the solid content in the obtained reaction product was 23.55% by mass. The molecular weight (Mw) of the obtained product (solid content) was 1,300. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 5

Into a flask, 81.05 g (contained in a ratio of 46.5 mol % in the total silanes) of tetraethoxysilane, 69.37 g (contained in a ratio of 46.5 mol % in the total silanes) of methyltriethoxysilane, 8.68 g (contained in a ratio of 7 mol % in the total silanes) of dimethyldiethoxysilane, and 238.66 g of acetone were charged. Into this flask, a dropping funnel equipped with a condenser and containing 52.24 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-2)). Further, acetone was replaced with propylene glycol monomethyl ether acetate by using the evaporator. As a result of measurement by a calcination method, the solid content in the obtained reaction product was 22.18% by mass. The molecular weight (Mw) of the obtained product (solid content) was 1,300. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 6

Into a flask, 66.21 g (contained in a ratio of 37.5 mol % in the total silanes) of tetraethoxysilane, 86.89 g (contained in a ratio of 57.5 mol % in the total silanes) of methyltriethoxysilane, 6.28 g (contained in a ratio of 5 mol % in the total silanes) of dimethyldiethoxysilane, and 239.07 g of acetone were charged. Into this flask, a dropping funnel equipped with a condenser and containing 51.54 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-2)). Further, acetone was replaced with propylene glycol monomethyl ether acetate by using the evaporator. As a result of measurement by a calcination method, the solid content in the obtained reaction product was 29.94% by mass. The molecular weight (Mw) of the obtained product (solid content) was 1,200. Thereafter, thus obtained polysiloxane was mixed in a ratio listed in Tables 1 and 2 and the resultant mixture was filtered with a filter having a pore diameter of 0.1 μm to give a polysiloxane composition for coating for pattern reversal.

Synthesis Example 7

Into a flask, 49.42 g (contained in a ratio of 27.5 mol % in the total silanes) of tetraethoxysilane, 103.82 g (contained in a ratio of 67.5 mol % in the total silanes) of methyltriethoxysilane, 6.40 g (contained in a ratio of 5 mol % in the total silanes) of dimethyldiethoxysilane, and 239.45 g of acetone were charged. Into this flask, a dropping funnel equipped with a condenser and containing 50.91 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-2)). Further, acetone was replaced with propylene glycol monomethyl ether acetate by using the evaporator. As a result of measurement by a calcination method, the solid content in the obtained reaction product was 29.28% by mass. The molecular weight (Mw) of the obtained product (solid content) was 1,200. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 8

Into a flask, 32.02 g (contained in a ratio of 17.5 mol % in the total silanes) of tetraethoxysilane, 121.37 g (contained in a ratio of 77.5 mol % in the total silanes) of methyltriethoxysilane, 6.51 g (contained in a ratio of 5 mol % in the total silanes) of dimethyldiethoxysilane, and 239.85 g of acetone were charged. Into this flask, a dropping funnel equipped with a condenser and containing 50.25 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-2)). Further, acetone was replaced with propylene glycol monomethyl ether acetate by using the evaporator. As a result of measurement by a calcination method, the solid content in the obtained reaction product was 27.70% by mass. The molecular weight (Mw) of the obtained product (solid content) was 1,100. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 9

Into a flask, 46.87 g (contained in a ratio of 40.0 mol % in the total silanes) of tetraethoxysilane, 40.12 g (contained in a ratio of 40.0 mol % in the total silanes) of methyltriethoxysilane, 16.68 g (contained in a ratio of 40.0 mol % in the total silanes) of vinyltrimethoxysilane, and 155.50 g of acetone were charged. Into this flask, a dropping funnel equipped with a condenser and containing 34.46 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-3)). Further, acetone was replaced with propylene glycol monomethyl ether acetate by using the evaporator. As a result of measurement by a calcination method, the solid content in the obtained reaction product was 22.40% by mass. The molecular weight (Mw) of the obtained product (solid content) was 1,200. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 10

Into a flask, 41.67 g (contained in a ratio of 40.0 mol % in the total silanes) of tetraethoxysilane, 26.75 g (contained in a ratio of 30.0 mol % in the total silanes) of methyltriethoxysilane, 26.75 g (contained in a ratio of 30.0 mol % in the total silanes) of phenyltrimethoxysilane, and 147.23 g of acetone were charged. Into this flask, a dropping funnel equipped with a condenser and containing 30.63 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-4)). Further, acetone was replaced with propylene glycol monomethyl ether acetate by using the evaporator. As a result of measurement by a calcination method, the solid content in the obtained reaction product was 24.50% by mass. The molecular weight (Mw) of the obtained product (solid content) was 1,100. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Synthesis Example 11

Into a flask, 92.64 g (contained in a ratio of 100.0 mol % in the total silanes) of vinyltrimethoxysilane, and 138.97 g of propylene glycol monomethyl ether acetate were charged. Into this flask, a dropping funnel equipped with a condenser and containing 33.79 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 14 hours. After completion of the reaction, the flask containing the reaction solution was naturally cooled and then attached to an evaporator. Ethanol generated during the reaction was removed to give a reaction product (polysiloxane) (corresponding to Formula (1-5)). As a result of measurement by a calcination method, the solid content in the obtained reaction product was 19.80% by mass. The molecular weight (Mw) of the obtained product (solid content) was 3,000. Thereafter, thus obtained polysiloxane was mixed in a ratio listed in Table 2 and the resultant mixture was filtered with a filter having a

Synthesis Example 12

Into a 500 ml flask equipped with a stirring bar, a thermometer, and a condenser, 17.70 g of 35% by weight tetramethyl ammonium hydroxide aqueous solution and 118.93 g of isopropanol were charged to prepare a reaction solvent. A mixed solution of 12.0 g (contained in a ratio of 20 mol % in the total silanes) of (4-(1-ethoxyethoxy)phenyl) trimethoxysilane, 29.88 g (contained in a ratio of 80 mol % in the total silanes) of methyltriethoxysilane, and 7.78 g of isopropanol was prepared. The mixed solution was added dropwise to the reaction solvent at room temperature while stirring the reaction solvent with a magnetic stirrer. After the addition, the resultant reaction liquid was reacted for 240 minutes while maintaining temperature at 40° C. with an oil bath. Thereafter, the reaction liquid was cooled to room temperature and 251 ml of ethyl acetate was added to the reaction liquid to dilute. The reaction liquid was neutralized by adding 0.2 mol % hydrochloric acid and the water phase of the separated two phases was removed. The remaining organic phase was further washed with 125 ml of water three times. To the obtained organic phase, 210 g of propylene glycol monomethyl ether was added. Ethyl acetate, isopropanol, methanol, ethanol, and water were removed by distillation under reduced pressure for concentrating the liquid to give the propylene glycol monomethyl ether solution of a hydrolysis condensate (polysiloxane). The obtained polymer corresponded to Formula (1-6) and the molecular weight (Mw) thereof measured with GPC in terms of polystyrene was 1600. Thereafter, thus obtained polysiloxane was mixed in a ratio listed in Table 3 and the resultant mixture was filtered with a filter having a pore diameter of 0.1 μm to give a polysiloxane composition for coating for pattern reversal.

Comparative Synthesis Example 1

Into a flask, 137.64 g (contained in a ratio of 85 mol % in the total silanes) of tetraethoxysilane, 20.79 g (contained in a ratio of 15 mol % in the total silanes) of methyltriethoxysilane, and 237.64 g of acetone were charged. Into this flask, a dropping funnel equipped with a condenser and containing 53.93 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-1)). Further, acetone was replaced with propylene glycol monomethyl ether acetate by using the evaporator. As a result of measurement by a calcination method, the solid content in the obtained reaction product was 20.22% by mass. The molecular weight (Mw) of the obtained product (solid content) was 1,400. Thereafter, thus obtained polysiloxane was mixed in a ratio listed in Table 2 and the resultant mixture was filtered with a filter having a pore diameter of 0.1 μm to give a polysiloxane composition for coating for pattern reversal.

Comparative Synthesis Example 2

Into a flask, 130.59 g (contained in a ratio of 80 mol % in the total silanes) of tetraethoxysilane, 27.94 g (contained in a ratio of 20 mol % in the total silanes) of methyltriethoxysilane, and 237.81 g of acetone were charged. Into this flask, a dropping funnel equipped with a condenser and containing 53.66 g of a prepared hydrochloric acid aqueous solution (0.01 mol/liter) was attached and the hydrochloric acid aqueous solution was slowly added dropwise at room temperature, followed by stirring the resultant solution for several minutes. Thereafter, the solution was reacted in an oil bath at 85° C. for 4 hours. After completion of the reaction, the flask containing the reaction solution was naturally cooled and then attached to an evaporator. Ethanol generated during the reaction was removed to give a reaction product (polysiloxane) (corresponding to Formula (1-1)). Further, acetone was replaced with propylene glycol monomethyl ether acetate by using the evaporator. As a result of measurement by a calcination method, the solid content in the obtained reaction product was 25.47% by mass. The molecular weight (Mw) of the obtained product (solid content) was 1,400. Thereafter, thus obtained polysiloxane was mixed in a ratio listed in Table 2 and the resultant mixture was filtered with a filter having a pore diameter of 0.1 μm to give a polysiloxane composition for coating for pattern reversal.

(Preparation of Polysiloxane Composition for Coating for Pattern Reversal)

As described above, the polysiloxanes obtained in Synthesis Examples 1 to 12 and Comparative Synthesis Examples 1 and 2, an acid, curing catalysts, additives, solvents, and water were mixed in ratios listed in Tables 1 to 3 and the resultant mixtures were filtered with a fluorocarbon resin filter having a pore diameter of 0.1 μm to prepare each solution of the polysiloxane compositions for coating. In Tables 1 to 3, ratios of the polymers to be added are not the amounts of the polymer solutions to be added but the amounts of the polymers themselves to be added.

In Tables 1 to 3, maleic acid is abbreviated as MA, benzyltriethylammonium chloride as BTEAC, N-(3-triethoxysilylpropyl)-4,5-dihydro-imidazole as IMIDTEOS, triphenylsulfonium nitrate as TPSNO3, mono triphenylsulfonium maleate as TPSMA, triphenylsulfonium trifluoroacetate as TPSTFA, triphenylsulfonium chloride as TPSCl, triphenylsulfonium camphorsulfonate as TPSCS, triphenylsulfonium trifluoromethanesulfonate as TPSTf, triphenylsulfonium nonafluorobutanesulfonate as TPSNf, triphenylsulfonium adamantanecarboxy-1,1,2-trifluorobutanesulfonate as TPSAdTF, dihydroxyphenylphenylsulfonium p-toluenesulfonate as DIITPPSpTS, bisphenylsulfone as BPS, tetramethoxymethylglycoluril (crosslinkable compound, manufactured by Mitsui Cytec Ltd., trade name Powderlink 1174) as PL-LI, pyridinium-p-toluenesulfonate as PyPTS, propylene glycol monomethyl ether acetate as PGMEA, propylene glycol monoethyl ether as PGEE, propylene glycol monomethyl ether as PGME, and diethylene glycol diethyl ether as DEG. As the water, ultrapure water was used. Each amount to be added was listed in part by mass.

TABLE 1

| | Polymer | Acid | Curing catalyst | Additive | Solvents | | | | |
|---|---|---|---|---|---|---|---|---|---|
| Example 1 (part by mass) | Synthesis Example 6 7.0 | | | | PGME 5 | PGEE 79 | PGMEA 9 | | |
| Example 2 (part by mass) | Synthesis Example 6 6.9 | MA 0.07 | BTEAC 0.02 | | PGME 5 | PGEE 79 | PGMEA 9 | | |
| Example 3 (part by mass) | Synthesis Example 6 6.9 | MA 0.07 | | | PGME 5 | PGEE 68 | PGMEA 9 | | Water 11 |
| Example 4 (part by mass) | Synthesis Example 6 6.9 | MA 0.07 | BTEAC 0.02 | | PGME 5 | PGEE 68 | PGMEA 9 | | Water 11 |
| Example 5 (part by mass) | Synthesis Example 6 6.9 | MA 0.07 | IMIDTEOS 0.02 | | PGME 5 | PGEE 68 | PGMEA 9 | | Water 11 |
| Example 6 (part by mass) | Synthesis Example 6 6.9 | MA 0.07 | IMIDTEOS 0.02 | | PGME 5 | PGEE 63 | PGMEA 9 | DEG 5 | Water 11 |
| Example 7 (part by mass) | Synthesis Example 6 6.9 | MA 0.07 | TPSNO3 0.02 | | PGME 5 | PGEE 68 | PGMEA 9 | | Water 11 |
| Example 8 (part by mass) | Synthesis Example 6 6.9 | MA 0.07 | TPSMA 0.02 | | PGME 5 | PGEE 68 | PGMEA 9 | | Water 11 |
| Example 9 (part by mass) | Synthesis Example 6 6.9 | MA 0.07 | TPSTFA 0.02 | | PGME 5 | PGEE 68 | PGMEA 9 | | Water 11 |
| Example 10 (part by mass) | Synthesis Example 6 6.9 | MA 0.07 | TPSCl 0.02 | | PGME 5 | PGEE 68 | PGMEA 9 | | Water 11 |
| Example 11 (part by mass) | Synthesis Example 6 6.9 | MA 0.07 | TPSMA 0.02 | TPSCS 0.02 | PGME 5 | PGEE 68 | PGMEA 9 | | Water 11 |
| Example 12 (part by mass) | Synthesis Example 6 6.9 | MA 0.07 | TPSNO3 0.02 | TPSTf 0.02 | PGME 5 | PGEE 68 | PGMEA 9 | | Water 11 |
| Example 13 (part by mass) | Synthesis Example 6 6.9 | MA 0.07 | BTEAC 0.02 | TPSNf 0.02 | PGME 5 | PGEE 68 | PGMEA 9 | | Water 11 |
| Example 14 (part by mass) | Synthesis Example 6 6.9 | MA 0.07 | IMIDTEOS 0.02 | DHTPPSpTS 0.02 | PGME 5 | PGEE 68 | PGMEA 9 | | Water 11 |

TABLE 2

| | Polymer | Acid | Curing catalyst | Additives | Solvent | | | |
|---|---|---|---|---|---|---|---|---|
| Example 15 (part by mass) | Synthesis Example 6 6.9 | MA 0.07 | TPSTFA 0.02 | TPSAdTF 0.02 | PGME 5 | PGEE 68 | PGMEA 9 | Water 11 |
| Example 16 (part by mass) | Synthesis Example 6 6.9 | MA 0.07 | TPSCl 0.02 | BPS 0.02 | PGME 5 | PGEE 68 | PGMEA 9 | Water 11 |
| Example 17 (part by mass) | Synthesis Example 6 6.9 | MA 0.07 | TPSNO3 0.02 | TPSAdTF 0.02 | PGME 5 | PGEE 68 | PGMEA 9 | Water 11 |
| Example 18 (part by mass) | Synthesis Example 1 6.9 | MA 0.07 | IMIDTEOS 0.02 | | PGME 5 | PGEE 68 | PGMEA 9 | Water 11 |
| Example 19 (part by mass) | Synthesis Example 2 6.9 | MA 0.07 | IMIDTEOS 0.02 | | PGME 5 | PGEE 68 | PGMEA 9 | Water 11 |
| Example 20 (part by mass) | Synthesis Example 3 6.9 | MA 0.07 | IMIDTEOS 0.02 | | PGME 5 | PGEE 68 | PGMEA 9 | Water 11 |
| Example 21 (part by mass) | Synthesis Example 4 6.9 | MA 0.07 | IMIDTEOS 0.02 | | PGME 5 | PGEE 68 | PGMEA 9 | Water 11 |
| Example 22 (part by mass) | Synthesis Example 5 6.9 | MA 0.07 | IMIDTEOS 0.02 | | PGME 5 | PGEE 68 | PGMEA 9 | Water 11 |
| Example 23 (part by mass) | Synthesis Example 7 6.9 | MA 0.07 | IMIDTEOS 0.02 | | PGME 5 | PGEE 68 | PGMEA 9 | Water 11 |
| Example 24 (part by mass) | Synthesis Example 8 6.9 | MA 0.07 | IMIDTEOS 0.02 | | PGME 5 | PGEE 68 | PGMEA 9 | Water 11 |
| Example 27 (part by mass) | Synthesis Example 9 6.9 | MA 0.07 | IMIDTEOS 0.02 | | PGME 5 | PGEE 68 | PGMEA 9 | Water 11 |
| Example 28 (part by mass) | Synthesis Example 10 6.9 | MA 0.07 | IMIDTEOS 0.02 | | PGME 5 | PGEE 68 | PGMEA 9 | Water 11 |
| Example 29 (part by mass) | Synthesis Example 11 6.9 | MA 0.07 | IMIDTEOS 0.02 | | PGME 5 | PGEE 68 | PGMEA 9 | Water 11 |
| Comparative Example 1 (part by mass) | Comparative Synthesis Example 1 6.9 | MA 0.07 | IMIDTEOS 0.02 | | PGME 5 | PGEE 68 | PGMEA 9 | Water 11 |
| Comparative Example 2 (part by mass) | Comparative Synthesis Example 2 6.9 | MA 0.07 | IMIDTEOS 0.02 | | PGME 5 | PGEE 68 | PGMEA 9 | Water 11 |

TABLE 3

| | Polymer | Crosslinkable compound | Curing Catalyst | Solvent | | | |
|---|---|---|---|---|---|---|---|
| | | | | PGME | PGEE | PGMEA | Water |
| Example 25 (part by mass) | Synthesis Example 12 7.0 | | | 5 | 68 | 9 | 11 |
| Example 26 (part by mass) | Synthesis Example 12 5.8 | PL-LI 1.16 | PyPTS 0.02 | 5 | 68 | 9 | 11 |

(Evaluation of Coating Performance)

For each of the polysiloxane compositions for coating in Examples 1 to 29 and Comparative Examples 1 and 2, the following coating performance was evaluated. The results are listed in Tables 4 and 5.

Figure 2:
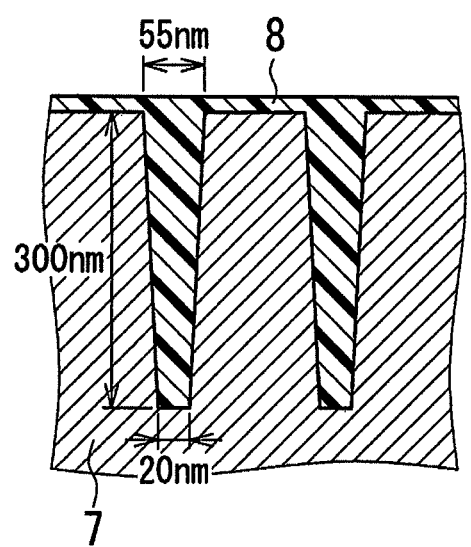
FIG. 2 is a sectional view illustrating stepped substrate formed of $SiO_2$ coated with the polysiloxane composition for coating of the present invention for evaluating a coating performance.

As illustrated in FIG. 2, each of the polysiloxane compositions for coating in Examples 1 to 29 and Comparative Examples 1 and 2 was applied onto a stepped substrate 7 using a spin coater under conditions of a rotation speed of 1,500 rpm for 60 seconds. Thereafter, the applied polysiloxane composition was dried on a hot plate at 215° C. for 1 minute to form the film of the polysiloxane composition for coating 8. The thickness of the film of the polysiloxane composition for coating 8 is 180 nm. The stepped substrate 7 has a hole pattern made of $SiO_2$ having a height of 300 nm and a minimum width of 20 nm. Subsequently, for the obtained film of the polysiloxane composition for coating 8, the coating performance was evaluated by observing the sectional shape with a cross-sectional SEM. The coating property of the polysiloxane composition for coating having no generation of voids and exhibiting a good coating property was evaluated to be good and the coating property of the polysiloxane composition for coating generating voids was evaluated to be poor.

TABLE 4

| Example 1 | Good |
|---|---|
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |

TABLE 5

| Example 13 | Good |
|---|---|
| Example 14 | Good |
| Example 15 | Good |
| Example 16 | Good |
| Example 17 | Good |
| Example 18 | Good |
| Example 19 | Good |
| Example 20 | Good |
| Example 21 | Good |
| Example 22 | Good |
| Example 23 | Good |
| Example 24 | Good |
| Example 25 | Good |
| Example 26 | Good |
| Example 27 | Good |
| Example 28 | Good |
| Example 29 | Good |
| Comparative Example 1 | Poor |
| Comparative Example 2 | Poor |

INDUSTRIAL APPLICABILITY

The present invention can provide a resin composition for pattern reversal that can be successively embedded between traces of the pattern of a stepped substrate and can form a smooth film to a stepped substrate formed on a substrate to be processed.

DESCRIPTION OF THE REFERENCE NUMERALS

1: Semiconductor Substrate
2: Semiconductor Substrate
3: Organic Underlayer Film
4: Silicon Hard Mask
5: Resist Film
6 and 8: Polysiloxane Composition Film
7: Stepped Substrate

The invention claimed is:

1. A method for producing a semiconductor device comprising the steps of:
   (1) forming an organic underlayer film onto a semiconductor substrate;
   (2) applying a silicon hard mask-forming composition on the organic underlayer film and baking the applied silicon hard mask-forming composition to form a silicon hard mask;
   (3) applying a resist composition onto the silicon hard mask to form a resist film;
   (4) exposing the resist film to light and developing the resist film after exposure to give a resist pattern;
   (5) etching the silicon hard mask using the resist pattern;
   (6) etching the organic underlayer film using the patterned silicon hard mask to form a patterned organic underlayer film;
   (7) applying a polysiloxane composition onto the patterned organic underlayer film to embed the polysiloxane composition between traces of the pattern of the organic underlayer film and exposing an upper surface of the organic underlayer film by etch back, wherein the polysiloxane composition comprises a solvent and a hydrolysis condensate of a hydrolyzable silane comprising the hydrolyzable silane having two to three hydrolyzable groups in a proportion of 30 mol % to 100 mol % in total silanes; and
   (8) etching the organic underlayer film to reverse the pattern.

2. The method for producing a semiconductor device according to claim 1, wherein the hydrolyzable silane is a hydrolyzable silane of Formula (1):

$$R^1_a Si(R^2)_{4-a} \quad \text{Formula (1)}$$

in which
- $R^1$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, or a cyano group and bonding to a silicon atom through a Si—C bond,
- $R^2$ is an alkoxy group, an acyloxy group, or a halogen group; and
- a is an integer of 0 to 2;
- and comprises a hydrolyzable silane, in which a in Formula (1) is 1 or 2, in a proportion of 30 mol % to 100 mol % and a hydrolyzable silane, in which a in Formula (1) is 0, in a proportion of 0 mol % to 70 mol % in the total silanes.

3. The method for producing a semiconductor device according to claim 2, wherein the composition comprises the hydrolysis condensate of the hydrolyzable silane comprising the hydrolyzable silane of Formula (1), where a is 1 or 2, in a proportion of 100 mol % in the total silanes and a crosslinkable compound having two to six methoxymethyl groups.

4. The method for producing a semiconductor device according to claim 2, wherein $R^1$ in Formula (1) is a methyl group or a phenyl group optionally substituted with a halogen group or an alkoxy group.

5. The method for producing a semiconductor device according to claim 1, wherein hydrolysis of the hydrolyzable silane is carried out using an acid or a base as a hydrolysis catalyst.

6. The method for producing a semiconductor device according to claim 1, wherein the polysiloxane composition further comprises one or more substances selected from the group consisting of water, an acid, and a curing catalyst.

* * * * *